(12) United States Patent
Krivokapic

(10) Patent No.: US 6,544,905 B1
(45) Date of Patent: Apr. 8, 2003

(54) METAL GATE TRIM PROCESS BY USING SELF ASSEMBLED MONOLAYERS

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 7 days.

(21) Appl. No.: 09/900,628

(22) Filed: Jul. 6, 2001

(51) Int. Cl.7 .............................................. H01L 21/31
(52) U.S. Cl. ..................... 438/784; 438/624; 438/672; 438/694; 438/700
(58) Field of Search ................. 438/784, 672, 438/624, 692, 700

(56) References Cited

U.S. PATENT DOCUMENTS

| | | | |
|---|---|---|---|
| 5,020,213 A | * | 6/1991 | Aronoff et al. ............... 29/603 |
| 6,284,634 B1 | * | 9/2001 | Rha ........................... 438/592 |
| 6,340,636 B1 | * | 1/2002 | Yoon .......................... 438/672 |
| 6,355,543 B1 | * | 3/2002 | Yu ............................. 438/535 |
| 6,365,466 B1 | * | 4/2002 | Krivokapic ................ 438/283 |

OTHER PUBLICATIONS

Younan Xia and George M. Whitesides, Soft Lithography, Annual Review of Materials Science, vol. 28, 1998, pp. 153–183.

Joanna Aizenberg, Andrew J. Black, George M. Whitesides, Controlling Local Disorder in Self–Assembled Monolayers by Patterning the Topography of Their Metallic Supports, Nature, vol. 394, Aug. 27, 1998, pp. 868–870.

* cited by examiner

Primary Examiner—Michael S. Lebentritt
Assistant Examiner—Pho M. Luu

(57) ABSTRACT

In a method of forming a metal gate of a semiconductor device, a substrate is provided, which includes a substrate body covered by a dielectric layer. A metal body having top and side surface is provided on the dielectric layer. A self-assembled monolayer is provided over the top and side surfaces of the metal body, and has an ordered region covering the top surface of the metal body and disordered regions covering the side surfaces of the metal body. The resulting structure is etched, the disordered regions of the self-assembled monolayer allowing etching of the side surfaces of the metal body while the ordered region of the self-assembled monolayer substantially blocks etching of the top surface of the metal body.

9 Claims, 3 Drawing Sheets

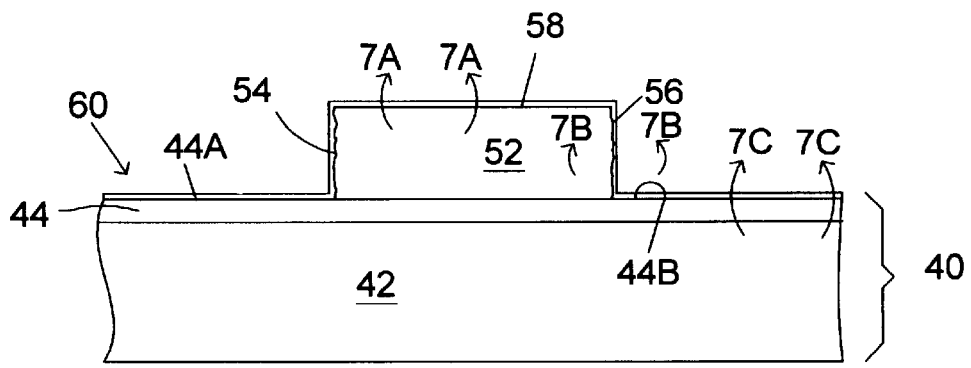
Figure 6
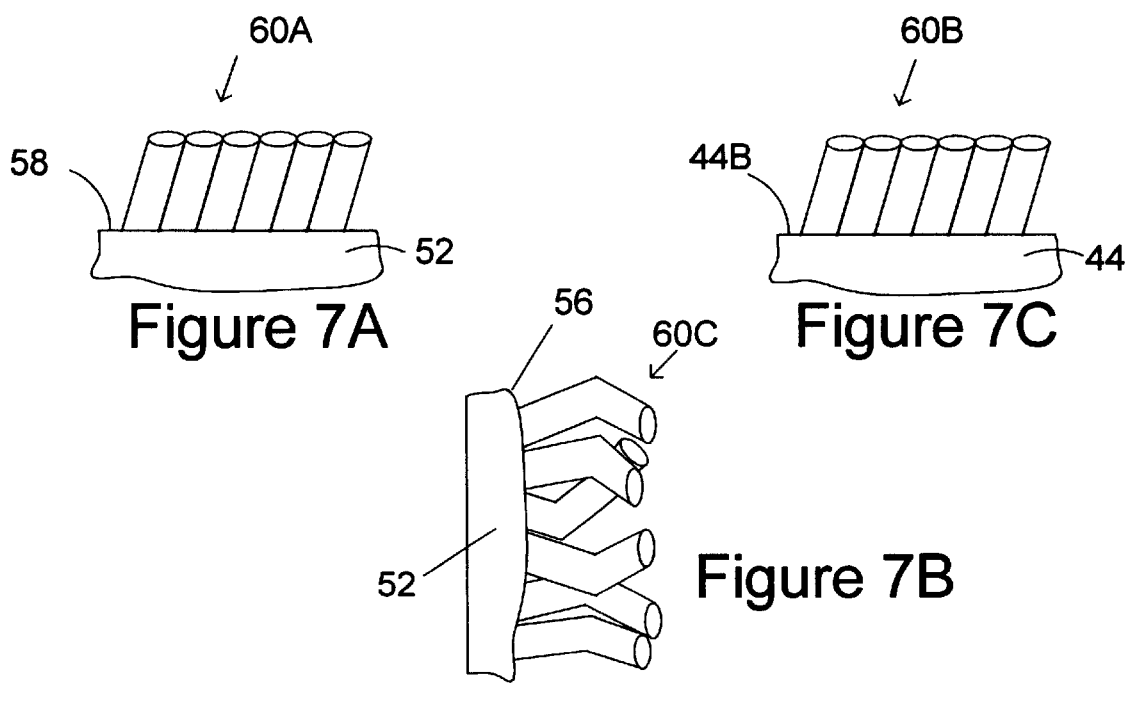
Figure 7A
Figure 7C
Figure 7B
Figure 7
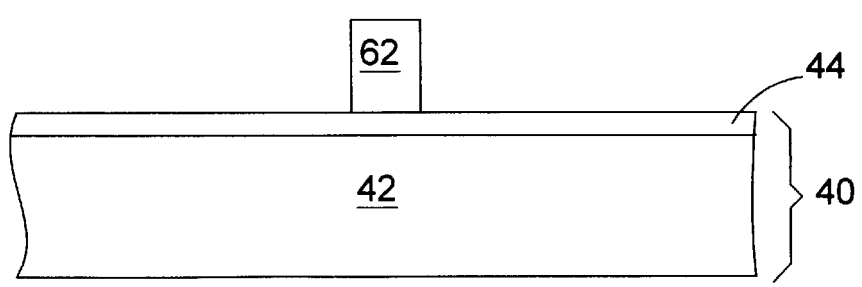
Figure 8

METAL GATE TRIM PROCESS BY USING SELF ASSEMBLED MONOLAYERS

BACKGROUND OF THE INVENTION

1. Field of the Invention

This invention relates generally to fabrication of semiconductor devices, and more particularly, to a trim process for a metal gate.

2. Discussion of the Related Art

The trend toward ultra large scale integration (ULSI) semiconductor technology, directed toward an effort to build integrated circuits with more and faster semiconductor devices, has resulted in continued shrinking of dimensions of the devices. For example, in circuits having field-effect transistors, a very important process is the formation of the gate for each transistor, in particular the width of such gate. In many applications, the switching speed and size of the transistor are functions of the width of the transistor gate. A narrower gate tends to produce a higher performance, i.e., faster transistor which is also smaller in size, i.e., narrower in width.

In a typical process for forming a metal gate device, photoresist 20 is patterned over a metal layer 22 disposed on an oxide layer 24, in turn disposed on a silicon base 26 (FIG. 1). The exposed metal is then etched, the patterned photoresist 20 being used as a mask during such etching step. Ideally, the formed gate is uniform in width, with such width being defined by and corresponding to the width of the photoresist mask 20. However, as attempts are made to decrease the gate width to, for example, less than 40 nm, the etching process has proven difficult to control, such that the sides 28, 30 of the gate 32 being formed become sloped and/or cupped in configuration, resulting in an improperly formed gate 32 (FIG. 2).

Therefore, what is needed is a method for properly forming a metal gate of a transistor, which gate is a very small and configuration, i.e., less than 40 nm wide.

SUMMARY OF THE INVENTION

In the present method of forming a metal gate of a semiconductor device, a substrate is provided, which substrate includes a substrate body and a dielectric layer thereon. A metal layer is provided over the dielectric layer, and a layer of photoresist is provided over the metal layer. The photoresist is patterned to expose portions of the metal layer, and the metal layer is etched, using the patterned photoresist as a mask. During such etching process, portions of the metal layer are etched away to in turn expose portions of the dielectric layer and leave a metal body on the dielectric layer, the metal body having a top surface and side surfaces. A self assembled monolayer is provided over the exposed portions of the dielectric layer and the top surface and side surfaces of the metal body, having ordered regions covering the top surface of the metal body and covering the exposed portions of the dielectric layer and disordered regions covering the side surfaces of the metal body. The resulting structure is etched, the disordered regions of the self assembled monolayer allowing etching of the side surfaces of the metal body while the ordered regions of the self assembled monolayer substantially block etching of the top surface of the metal body and exposed portions of the dielectric layer.

The present invention is better understood upon consideration of the detailed description below, in conjunction with the accompanying drawings. As will become readily apparent to those skilled in the art from the following description, there is shown and described (an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIG. 6 is a sectional view similar to that shown in FIG. 5, showing a further step in the present process;

FIG. 7 includes FIGS. 7A, 7B, and 7C which are enlarged views of portions of the device indicated by lines 7A—7A, 7B—7B, and 7C—7C, as shown in FIG. 6; and FIG. 8 is a sectional view similar to that shown in FIG. 6, showing a further step in the present process.

DETAILED DESCRIPTION

Reference is now made in detail to specific embodiment of the present invention which illustrates the best mode presently contemplated by the inventor for practicing the invention.

Figure 1:
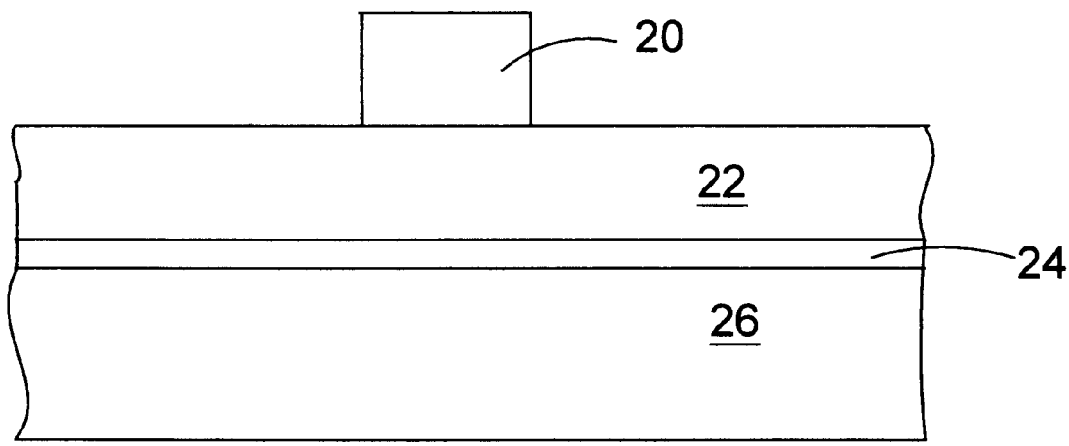
FIG. 1 is a sectional view showing a first step in a typical prior art process.
Figure 2:
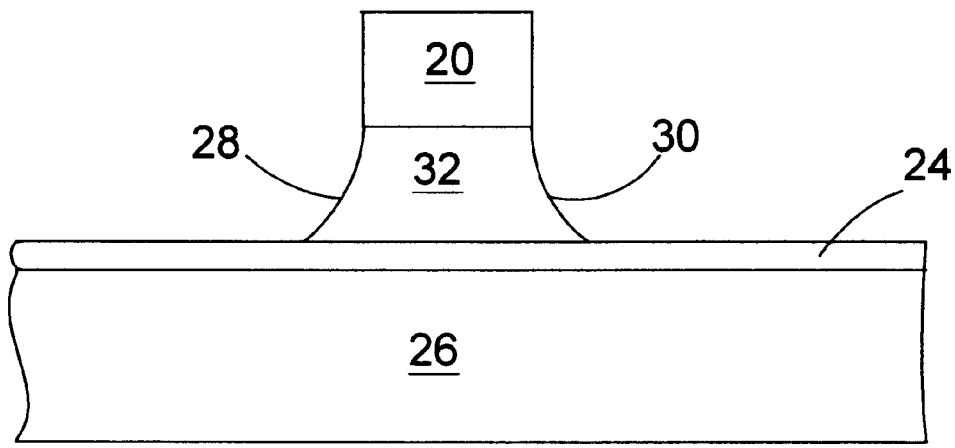
FIG. 2 is a sectional view similar to that shown in FIG. 1, showing a further step in the prior art process.
Figure 3:
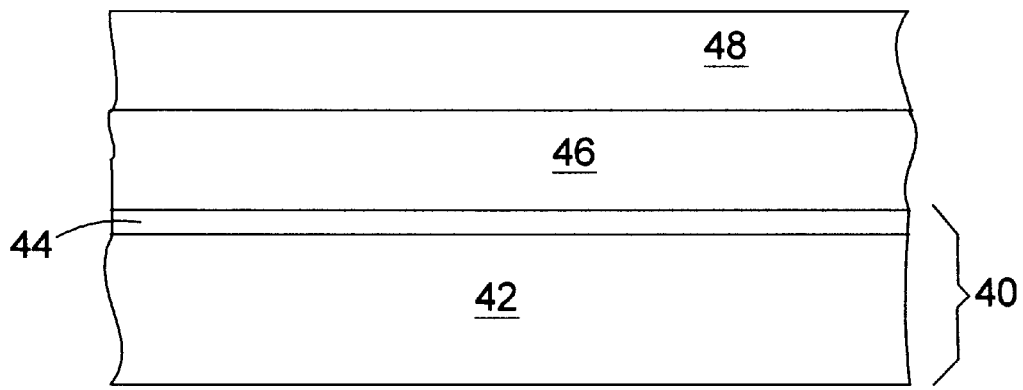
FIG. 3 is a sectional view showing a first step in the present process.
Figure 4:
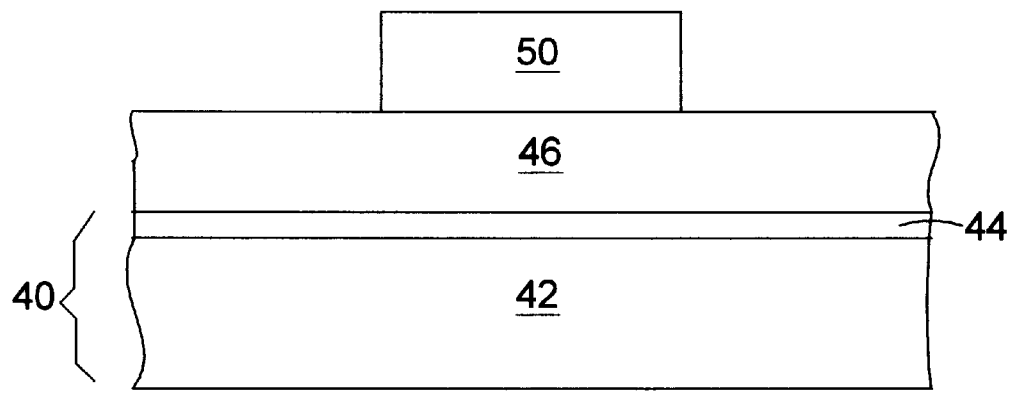
FIG. 4 is a sectional view similar to that shown in FIG. 3, showing a further step in the present process.

FIG. 3 illustrates a first step in the present invention. As shown therein, a substrate 40 is made up of a silicon wafer 42 having a dielectric in the form of an oxide layer 44 thereon. A metal layer 46, for example Ag, Al, Ta, Ti, TiN, TaN, TaSiN, W, Ni, Co, or Ir, is provided over the dielectric 44, and a layer of photoresist 48 is provided over the metal layer 46. The photoresist layer 48 is patterned to expose portions of the metal layer 46, and to define a photoresist mask 50. Using the patterned photoresist 50 as a mask, an anisotropic etching step, using for example $Cl_2+BCl_3$ as an etchant, is undertaken to etch away portions of the metal layer 46. During this step, portions 44A, 44B of the oxide layer 44 are exposed, and a metal body 52 is left on the oxide layer 44 (FIG. 5), which metal body 52 has side surfaces 54, 56 and a top surface 58 as shown in cross section. The metal body 52 thus far formed by conventional steps may have a width of for example 120 nm.

Figure 5:
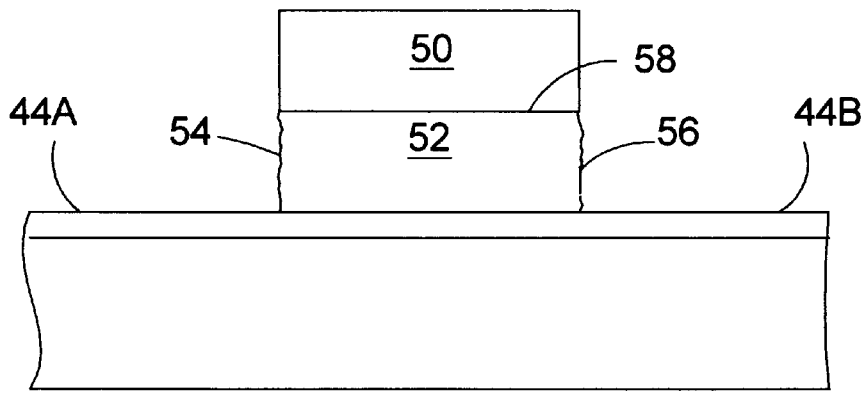
FIG. 5 is a sectional view similar to that shown in FIG. 4, showing a further step in the present process.

A characteristic of this etching step is that the side surfaces 54, 56 of the metal body 52 are relatively rough or irregular in character due to the etchant having acted thereon (irregularity shown exaggerated in FIG. 5 for clarity).

The article "Controlling local disorder in self-assembled monolayers by pattering the topography of their metallic supports", by Joanna Alzenberg, Andrew J. Black and George M. Whitesides, NATURE, Vol. 394, Aug. 27, 1998, pages 868–871, herein incorporated by reference, discusses disorder of self assembled monolayers as related to the topography of metallic elements on which they are disposed. Practice of the process disclosed therein causes the molecules of the self assembled monolayer to be disordered at a transition in topography between one metallic surface and another, meanwhile with the molecules of the self assembled monolayer being in an ordered state along a smooth metallic surface. As further revealed in the Alzenberg et al. article, upon an etching step being undertaken, the ordered regions block etching of the metal thereunder, while the disordered regions allow etching of the metal thereunder, so that selective etching of the metal under the self assembled monolayer can be achieved.

In furtherance of the practice of the present invention, a self assembled monolayer 60 is formed over the exposed portions 44 A, 44 B of the layer 44 and the top surface 58 and side surfaces 54, 56 of the metal body 52 (FIG. 6), in accordance with the process set forth in the Alzenberg et al. article. As set forth in that article, because of the relative smoothness of the top surface 58 of the metal body 52 and the exposed portions 44A, 44B of the oxide layer 44, ordered regions 60A, 60B of the self assembled monolayer 60 will cover the top surface 58 of the metal body 52 (FIG. 7A) and the exposed portions 44A, 44B of the oxide layer 44 (FIG. 7C). Meanwhile, because of the relative roughness or irregularity of the side surfaces 54, 56 of the metal body 52, disordered regions 60C of the self assembled monolayer 60 will cover these side surfaces 54, 56 (FIG. 7B).

Next, an etching step is undertaken, and the self assembled monolayer 60 will provide selective etching as described above. That is, the ordered portions 60A, 60B of the self assembled monolayer 60 covering the top surface 58 of the metal body 52 and exposed portions 44, 44B of the oxide layer 44 will act as a mask to block these regions from being etched. Meanwhile, etching of the side surfaces 54, 56 of the metal body 52 are allowed by the disordered portions 60C of the self assembled monolayer 60 covering these side surfaces 54, 56. Through this process, a properly formed narrow metal line 62, for example, 40 nm or less in width (in this embodiment a metal gate of a transistor to be completed by further process steps) is formed (FIG. 8).

It will be seen that herein is disclosed a process for forming narrow metal lines in semiconductor technology. The process is simple and effective, and results in the formation of properly configured narrow metal lines, for example, the gates of transistors.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of forming a metal line of a semiconductor structure comprising:

providing a metal body on a substrate, the metal body having first and second surfaces;

providing a self-assembled monolayer over the first and second surfaces of the metal body, having an ordered region covering the first surface of the metal body and a disordered region covering the second surface of the metal body; and etching the resulting structure, the disordered region of the self-assembled monolayer allowing etching of the second surface of the metal body while the ordered region self-assembled monolayer substantially blocks etching of the first surface of the metal body.

2. The method of claim 1, further comprising the method of forming a metal line is a method of forming a metal gate.

3. The method of claim 2, further comprising the substrate comprises a dielectric layer on which the metal body is provided.

4. A method of forming a metal line of a semiconductor structure comprising:

providing a metal body on a substrate, the metal body having a top surface and a side surface;

providing a self-assembled monolayer over the top surface and side surface of the metal body, having an ordered region covering the top surface of the metal body and a disordered region covering the side surface of the metal body; and etching the resulting structure, the disordered region of the self-assembled monolayer allowing etching of the side surface of the metal body while the ordered region of the self-assembled monolayer substantially blocks etching of the top surface of the metal body.

5. The method of claim 4, further comprising the method of forming a metal line is a method of forming a metal gate.

6. The method of claim 5, further comprising the substrate comprises a dielectric layer on which the metal body is provided.

7. A method of forming a metal line of a semiconductor structure comprising:

providing a substrate with a dielectric layer thereon;

providing a metal body on the dielectric layer, the metal body having a top surface and side surfaces;

providing a self-assembled monolayer over the top and side surfaces of the metal body, having an ordered region covering the top surface of the metal body and disordered regions covering the side surfaces of the metal body; and etching the resulting structure, the disordered regions of the self-assembled monolayer allowing etching of the side surfaces of the metal body while the ordered region of the self-assembled monolayer substantially blocks etching of the top surface of the metal body.

8. A method of forming a metal line of a semiconductor structure comprising:

providing a substrate with a dielectric layer thereon;

providing a metal layer over the dielectric layer;

providing a layer of photoresist over the metal layer;

patterning the photoresist to expose portions of the metal layer;

etching the metal layer, using the patterned photoresist as a mask, to etch away portions of the metal layer to in turn expose portions of the dielectric layer and leave a metal body on the dielectric layer, the metal body having a top surface and side surfaces;

providing a self-assembled monolayer over the exposed portions of the dielectric layer and the top surface and side surfaces of the metal body, having ordered regions covering the top surface of the metal body and covering the exposed portions of the dielectric layer and disordered regions covering the side surfaces of the metal body; and etching the resulting structure, the disordered regions of the self-assembled monolayer allowing etching of the side surfaces of the metal body while the ordered regions of the self-assembled monolayer substantially block etching of the top surface of the metal body and the exposed portions of the dielectric layer.

9. The method of claim 8, further comprising the method of forming a metal line is a method of forming a metal gate.

* * * * *